United States Patent [19]
Cunningham

[11] 3,980,965
[45] Sept. 14, 1976

[54] FREQUENCY RESPONSE CONTROL CIRCUIT APPARATUS

[75] Inventor: Vernon R. Cunningham, Melissa, Tex.

[73] Assignee: Rockwell International Corporation, El Segundo, Calif.

[22] Filed: May 16, 1975

[21] Appl. No.: 578,250

[52] U.S. Cl. .................................. 330/31; 330/29; 330/94
[51] Int. Cl.² ............................................ H03F 3/04
[58] Field of Search ................. 330/21, 31, 29, 94, 330/107; 333/28 T; 179/1 D

[56] References Cited
UNITED STATES PATENTS

| | | |
|---|---|---|
| 3,566,294 | 2/1971 | Takahashi ..................... 330/21 UX |
| 3,683,293 | 8/1972 | Matsui ............................ 330/94 X |
| 3,816,661 | 6/1974 | Huszty et al. ................... 179/1 D |

FOREIGN PATENTS OR APPLICATIONS

| | | |
|---|---|---|
| 1,556,557 | 2/1968 | France ............................ 330/31 |

*Primary Examiner*—James B. Mullins
*Attorney, Agent, or Firm*—Bruce C. Lutz; Robert J. Crawford

[57] ABSTRACT

The present circuit comprises a simple variable capacitive coupling to ground for two outputs of a two-output amplifier wherein the frequency gain is either boosted or cut in accordance with the setting of a reactive coupling device. For high frequencies this may be capacitive and for low frequencies this may be inductive.

8 Claims, 3 Drawing Figures

FREQUENCY RESPONSE CONTROL CIRCUIT APPARATUS

THE INVENTION

The present invention is generally concerned with electronics and more specifically is concerned with apparatus for controlling the frequency response of an amplifier circuit.

There have been many means of attaining a designated frequency response in the prior art and they have tended to fall in one of four categories. The present invention tends to fall in the fourth category but does not have the disadvantages of any of the known prior art in the four categories.

Category 1 comprises controls which will provide either boost or cut but not both. The disadvantage of this category of control is that there is only one type of correction provided.

Category 2 uses individual controls for boost and cut with the disadvantage being the increased circuit complexity and cost of two controls plus the associated circuitry to accomplish the desired result.

In Category 3 a fixed boost or cut is placed at a separate location in some associated circuitry and at the control position in the circuit the opposite characteristic of cut (or boost) is included in a method that is controllable and with sufficient range to not only overcome the fixed correction installed elsewhere, but to also correct a desired amount beyond this. The total correction available is then the fixed correction in one direction, and the total variable correction minus the fixed correction in the opposite direction. The disadvantage of the circuits of this category is that two different places in the circuit are required for the corrective circuitry and there are many additional components required over the present circuit. Further, the error may have to be increased at some point in the circuit before it is finally corrected.

The fourth category uses controls with a single element within a network of parts. However, all known previous circuits have required a large number of parts wherein the cost was excessive.

The present invention, on the other hand, uses a single potentiometer connected across the two output terminals of a three-terminal amplifier and a reactance such as a capacitor is connected from a wiper of the potentiometer to ground. When this inventive concept is applied to a common emitter connected transistor amplifier, the potentiometer is connected across the collector and emitter. When the potentiometer wiper is at the emitter end and a capacitor is used, the high frequency signals are bypassed to ground thereby lowering the emitter impedance with respect to signals of this frequency and raising the gain of the amplifier's stage. Therefore, the amplitude of output signals at the high frequency ranges are increased relative to the low frequency signals. If the wiper is moved on the potentiometer so that the capacitor is effectively connected to the collector, the high frequency signals are bypassed to ground from the output and thus there is a cut in relative amplitude of the high frequency signals as compared to the amplitude of the low frequency signals. When the potentiometer wiper is at any point between these two extremes, the resultant will be a combination of the two responses.

It is, thus, an object of the present invention to provide an improved frequency response control circuit.

Other objects and advantages of the present invention may be ascertained from a reading of the specification and appended claims in conjunction with the drawings wherein:

DETAILED DESCRIPTION

Figure 1:
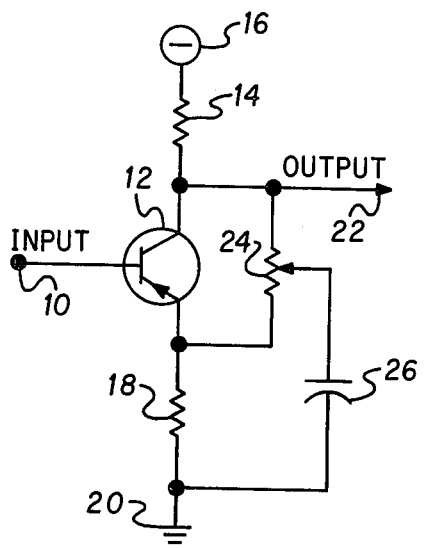
FIG. 1 is a schematic diagram of a preferred embodiment of the invention.

In FIG. 1, an input signal is applied on lead 10 to the base of a PNP transistor generally designated as 12 having its collector connected through a resistor 14 to a negative power source 16 and its emitter connected through a resistor 18 to ground or reference potential 20. An output terminal 22 is connected to the collector of transistor 12. The ends of a potentiometer generally designated as 24 are connected to the emitter, and collector terminals of transistor 12 and the wiper of potentiometer 24 is connected through a capacitor or reactance means 26 to ground 20.

Figure 2:
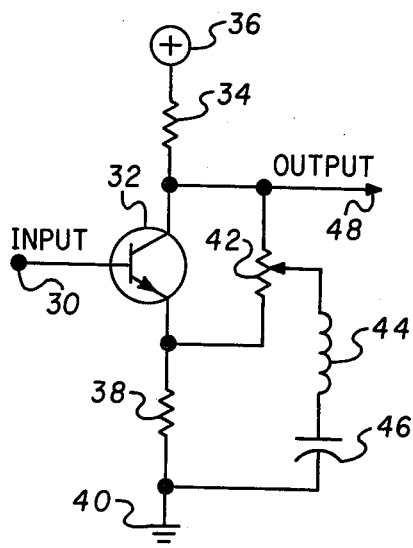
FIG. 2 is a schematic diagram of a further embodiment of the present inventive concept.

In FIG. 2, an input 30 is connected to a base of a NPN transistor generally designated as 32 having its collector connected through a resistor 34 to a positive power source 36 and its emitter connected through a resistor 38 to ground or reference potential 40. A potentiometer generally designated as 42 is connected across the emitter and collector of transistor 32 and its wiper is connected through an inductive load or reactance 44 and a capacitor 46 to ground 40. An output terminal 48 is connected to the collector of transistor 32.

Figure 3:
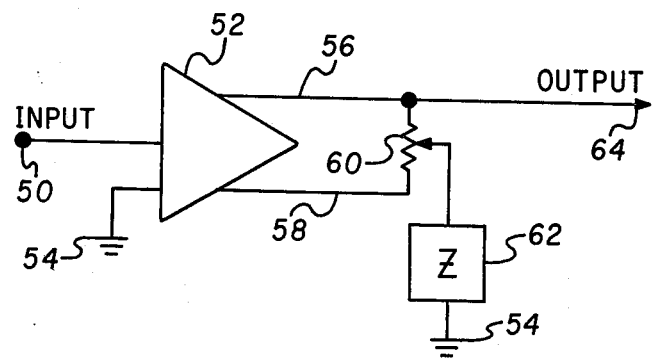
FIG. 3 is a block schematic diagram of the general concept of the invention.

In FIG. 3, an input signal is applied on a lead 50 of an amplifier generally designated as 52 having a further input connected to ground or reference potential 54. The amplifier 52 has first and second out-of-phase outputs appearing on leads 56 and 58. A potentiometer or variable resistance means 60 is connected across terminals 56 and 58 and a wiper thereof is connected through a reactance 62 to ground 54. An output 64 is provided from the amplifier circuit on lead 56.

OPERATION

Referring to FIG. 1, it will be noted that transistor 12 is connected in a common emitter configuration with an emitter resistor 18 and a load resistor 14. In this configuration as is known in the art, the resistor 18 not only stabilizes the output signals but reduces the gain. The resistor 14 is used as a load to provide an output signal while still providing power and (depending on resistor values) voltage gain over that supplied to input 10. If the resistor 18 were shorted the gain at the collector of transistor 12 would be much higher although less stable with variations in temperature. The operation of the frequency response circuit is such that the capacitor 26 may be electrically connected in parallel with only resistor 18 by moving the wiper of potentiometer 24 to its lowermost position. In this condition, the low frequency signals are not bypassed through capacitor 26 because of its reactance and thus the gain of the transistor is relatively low. However, as the frequency of the signals is incrased, a larger percentage of the signals' amplitude pass through capacitor 26 and the effective emitter impedance is lowered. Thus, the gain of the transistor circuit in its common emitter configuration is raised. Therefore, at the lower position the gain of the high frequency signal is increased. If the wiper of potentiometer 24 is raised to its position closest electrically to terminal 22, the capacitor 26 has relatively little effect on the emitter impedance. Rather, it has almost all of its effect on the collector impedance 14. By bypassing the resistor 14 as concerns the high frequency signals, there is relatively little load impedance to form the voltage amplitude output of these high frequency signals. Thus, the high frequency response or gain of the circuit is reduced both in an absolute sense and as compared to the low frequency response. When the wiper of potentiometer 24 is moved away from either of these extremes, there is some of each of the previously described actions occurring.

One model of the circuit of FIG. 1 was designed wherein resistors 14 and 18 were 560 ohms, the bias at the base of transistor 12 was set at −7 volts, and the power source 16 was −20 volts. The main element in potentiometer 24 was 500 ohms and the capacitor 26 had a capacitance of 91 picofarads. With this configuration, linear control was obtained up to 10 megahertzs. The size of potentiometer 24 and the capacitance of capacitor 26 may be chosen in accordance with the following considerations taking into account the impedances of resistors 14 and 18 and the impedance of transistor 12:

$C = 1/WR_1$ $R = A$ resistor whose value is as small as practical in view of the power handling capabilities of the associated transistor and falls in the range of zero to three times the value of $R_1$. where, $C =$ capacitance in farads $R =$ resistance of potentiometer in ohms $R_1 =$ emitter impedance $R_2 =$ collector impedance $W =$ the frequency in radians at which the response has dropped 3 dB when the potentiometer is adjusted such that its wiper is connected to the collector of the transistor.

$R_2$ is normally set equal to $R_2$. However, it may vary from this value in order to obtain a small amount of gain if the potentiometer is allowed to be set off center for a flat response.

The pole-zero locations are obtained from the transfer function:

$$T = \frac{R_2[1 + SCX(R_1 + (1 - X)R)]}{R_1[1 + SC(1 - X)(R_2 + XR)]}$$

where, $S =$ complex frequency variable (JW)

$X =$ fraction of potentiometer (R) on collector side of tap and $h_{fe}$ of the transistor is in finite.

FIG. 2 illustrates the inventive concept wherein the boost or cut is applied to low frequency signals. In this circuit the capacitor 46 has a large value and thus has a very small amount of reactive impedance for the frequencies involved. As will be ascertained, if the wiper of potentiometer 42 is turned to its lowermost position wherein the inductor 44 parallels resistor 38, the gain of transistor 32 will be highest for low frequency signals. If the wiper is changed to the uppermost position adjacent the collector of transistor 32, the inductor 44 will parallel the resistor 34 and the gain of the low frequency signals will be the lowest.

While the transistor 32 is shown as an NPN transistor and the transistor 12 of FIG. 1 is a PNP transistor, this is of no significance as concerns the type or reactive elements used. Rather, the two types of transistors were merely used for illustrative convenience.

In FIG. 3, the same concept is illustrated in the more general form wherein the potentiometer is merely connected across two out-of-phase output leads from amplifier 52 and the capacitor 62 variably couples the two output leads to alter the reactance to ground for given frequencies. Amplifier 52 is so constructed that a reactance placed on one of the outputs affects the response on the other output. As illustrated, reactance 62 may be either inductive or capacitive and thus FIG. 3 shows the general embodiment of the inventive concept.

While several different circuits have been discussed above, the inventive concept is not limited thereto, but rather to the general concept of variably and inversely coupling a reactive component to two output leads of an amplifier wherein the two output leads have out-of-phase signals. I, therefore, wish to be limited not by the invention specifically disclosed but rather by the scope of the appended claims.

What is claimed is:

1. Circuit apparatus for variably and linearly boosting or attenuating a designated frequency band of signals flowing therethrough with respect to another frequency band of signals consisting, in combination:

signal supplying input means for supplying signals varying over a range of frequencies;

reference potential means;

power source means;

signal amplifier means having input means connected to said signal supplying input means for receiving signals therefrom and having first and second output means;

circuit apparatus signal output means connected to said first output means of said signal amplifier means for receiving output signals therefrom;

first resistance means connecting one of said first and second output means of said signal amplifier means to said reference potential means;

second resistance means connecting one of said first and second output means of said signal amplifier means to said power source means;

potentiometer means having a wiper terminal means and further having end terminal means;

means directly connecting a first end terminal means of said potentiometer means to said first output means of said signal amplifier means;

further means directly connecting a second end terminal means of said potentiometer to said second output means of said signal amplifier means; and signal reactive means connected between said wiper terminal means of said potentiometer means and said reference potential means said signal reactive means being non-resonant over said designated frequency band of signal, the connection of said potentiometer means and said signal reactive means providing variable and linear boost or attenuation over a designated frequency band in accordance with the position of the wiper on said potentiometer means.

2. Apparatus as claimed in claim 1 wherein: said signal reactive means is a capacitor.

3. Apparatus as claimed in claim 1 wherein said signal amplifier means is a transistor with one of the emitter and collector leads being said first output means and the other being said second output means.

4. Apparatus as claimed in claim 1 wherein the reactive means is a capacitor and the potentiometer and capacitor values are selected in accordance with the formula:

$C = 1/WR_1$ $R$ = a resistor whose value falls in the range of zero to three times the value of $R_1$.

where, $C$ = capacitance in farads
$R$ = resistance of potentiometer in ohms
$R_1$ = emitter resistor
$R_2$ = collector resistor
$R_1 = R_2$
$W$ = the frequency in radians 5. Direct current frequency response adjustment apparatus for linearly controlling the high frequency response in boost or attenuation with respect to the low frequency response over a given range of frequencies, consisting of, in combination:

three terminal amplifying means including signal input means and first and second output means;
reference potential means;
potentiometer means having the ends thereof directly connected across said first and second output means of said amplifying means and further having a wiper output; and
capacitive means connected between said wiper output and said reference potential means for linearly controlling the amplitude of high frequency signals outputted by said amplifying means as compared to the amplitude of low frequency signals said capacitive means being non-resonant over said range of frequencies.

6. Frequency response adjustment apparatus for linearly and variably controlling the low frequency response in boost or attenuation with respect to the high frequency response and capable of passing direct current signals consisting, in combination:

three terminal amplifying means including signal input means and first and second output means;
reference potential means;
potentiometer means having the ends thereof directly connected across said first and second output means of said amplifying means and further having a wiper output; and
non-resonant reactive means connected between said wiper output and said reference potential means for linearly and variably controlling the amplitude of high frequency signals outputted by said amplifying means as compared to the amplitude of low frequency signals.

7. Apparatus for linearly controlling and varying the high frequency response of a transistor amplifier stage having the signal output derived from the collector thereof consisting, in combination:

means for capacitively coupling a first terminal means to ground through one portion of a variable resistor and for capacitively coupling a second terminal means to ground through the remaining portion of said variable resistor, and
means for connecting said first and second terminal means to the emitter and collector respectively of said transistor amplifier stage wherein the linear control circuit is not resonant over the frequency response control range, the capacitive coupling to ground of the emitter and collector through the variable resistor portions providing linear control of the high frequency response of the amplifier stage.

8. Apparatus for linearly controlling and varying the low frequency response of a transistor amplifier stage having the signal output derived from the collector thereof consisting, in combination:

means for inductively coupling a first terminal means to ground through one portion of a variable resistor and for inductively coupling a second terminal means to ground through the remaining portion of said variable resistor; and
means for connecting said first and second terminal means to said emitter and collector respectively of said transistor amplifier stage wherein the linear control circuit is not resonant over the frequency response control range.

* * * * *

UNITED STATES PATENT OFFICE
CERTIFICATE OF CORRECTION

Patent No. 3,980,965　　　　　　　　　Dated September 14, 1976

Inventor(s) Vernon R. Cunningham

It is certified that error appears in the above-identified patent and that said Letters Patent are hereby corrected as shown below:

In the Abstract, line 3, after "is" insert --linearly--;

Col. 2, line 64, delete "incrased" and substitute therefor --increased--;

Col. 3, line 42, delete "$R_2$" (first instance) and substitute therefor --$R_1$--;

Col. 4, line 53, after "potentiometer" insert --means--; and

Signed and Sealed this

Twenty-eighth Day of December 1976

[SEAL]

Attest:

RUTH C. MASON　　　　　　　　　C. MARSHALL DANN
Attesting Officer　　　　　　　Commissioner of Patents and Trademarks